(12) United States Patent
Park

(10) Patent No.: US 7,199,041 B2
(45) Date of Patent: Apr. 3, 2007

(54) METHODS FOR FABRICATING AN INTERLAYER DIELECTRIC LAYER OF A SEMICONDUCTOR DEVICE

(75) Inventor: Geon Ook Park, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 213 days.

(21) Appl. No.: 10/964,307

(22) Filed: Oct. 12, 2004

(65) Prior Publication Data

US 2005/0079734 A1 Apr. 14, 2005

(30) Foreign Application Priority Data

Oct. 11, 2003 (KR) ............... 10-2003-0070851

(51) Int. Cl.
*H01L 21/473* (2006.01)
*H01L 21/31* (2006.01)
*H01L 21/469* (2006.01)

(52) U.S. Cl. ............... 438/624; 438/631; 438/778; 257/760; 257/E21.276

(58) Field of Classification Search ............... 438/624, 438/778, 763, 761, 783, 784, 631, 633; 257/E21.274, 257/760, E21.276
See application file for complete search history.

(56) References Cited

U.S. PATENT DOCUMENTS

| 6,027,996 | A | * | 2/2000 | Wu et al. ............... 438/624 |
|---|---|---|---|---|
| 6,165,915 | A | * | 12/2000 | Jang ............... 438/787 |
| 6,232,217 | B1 | * | 5/2001 | Ang et al. ............... 438/624 |
| 6,284,644 | B1 | * | 9/2001 | Aug et al. ............... 438/623 |
| 6,303,418 | B1 | * | 10/2001 | Cha et al. ............... 438/199 |
| 6,303,519 | B1 | | 10/2001 | Hsiao ............... 438/758 |
| 6,376,360 | B1 | * | 4/2002 | Cha et al. ............... 438/624 |
| 6,451,687 | B1 | * | 9/2002 | Liu et al. ............... 438/624 |
| 6,531,382 | B1 | * | 3/2003 | Cheng et al. ............... 438/597 |
| 6,586,347 | B1 | | 7/2003 | Liu et al. ............... 438/778 |
| 6,727,588 | B1 | * | 4/2004 | Abdelgadir et al. ............... 257/751 |
| 6,759,347 | B1 | * | 7/2004 | Cheng et al. ............... 438/778 |
| 6,777,308 | B2 | * | 8/2004 | Li et al. ............... 438/424 |
| 6,953,608 | B2 | * | 10/2005 | Leu et al. ............... 427/576 |
| 2003/0211725 | A1 | * | 11/2003 | Chung et al. ............... 438/630 |
| 2005/0014360 | A1 | * | 1/2005 | Yu et al. ............... 438/622 |
| 2005/0186799 | A1 | * | 8/2005 | Wu et al. ............... 438/692 |

* cited by examiner

Primary Examiner—M. Wilczewski
(74) Attorney, Agent, or Firm—Saliwanchik, Lloyd & Saliwanchik

(57) ABSTRACT

Methods for fabricating an interlayer dielectric layer of a semiconductor device are disclosed. An illustrated method comprises forming a metallic interconnect on a substrate; depositing an SRO layer on the metallic interconnect while the substrate is located in a chamber; and forming an FSG layer on the SRO layer without removing the substrate from the chamber.

7 Claims, 1 Drawing Sheet

METHODS FOR FABRICATING AN INTERLAYER DIELECTRIC LAYER OF A SEMICONDUCTOR DEVICE

FIELD OF THE DISCLOSURE

The present disclosure relates generally to semiconductor fabrication and, more particularly, to methods for fabricating an interlayer dielectric layer (hereinafter referred to as "ILD") of a semiconductor device.

BACKGROUND

Typically, as the degree of integration in semiconductor devices advances, the number of metallic interconnects increases, but the pitch of the metallic interconnects decreases. The diminution of the pitch increases the resistance of the metallic interconnects. Moreover, a metallic interconnect adjacent an interlayer dielectric layer (hereinafter referred to as an "ILD") may form a parasitic capacitor structure which degrades the characteristics of the associated semiconductor device. For example, the RC constant, (which determines the response time of the semiconductor device), and the power consumption of the semiconductor device may be increased by this parasitic capacitance.

One obvious solution to these problems is to employ an ILD with a low dielectric constant to manufacture highly integrated semiconductor devices. To this end, a fluorine doped silicate glass (hereinafter referred to as "FSG") layer, is often used as the ILD because it has a low dielectric constant. The dielectric constant of the FSG layer varies with the concentration of fluorine in the FSG layer. For example, the dielectric constant of the FSG layer increases as the concentration of fluorine increases. However, when the concentration of fluorine is high, the fluorine of the FSG layer is easily coupled with moisture; thereby causing corrosion of the metallic interconnect(s). Due to this trade-off, an FSG layer having a relatively high dielectric constant (e.g., about 3.5) is typically used.

FIG. 1 is a cross-sectional view illustrating a conventional semiconductor device. Referring to FIG. 1, metallic interconnects 12 are formed over a substrate 11 which may include, for example, active devices. A barrier layer 13 is deposited on the substrate 11 and interconnects 12. Subsequently, an FSG layer 14 including fluorine is formed as an ILD on the barrier layer 13. A diffusion protective layer 15 is then deposited on the FSG layer 14. The barrier layer 13 prevents damage to the metallic interconnects 12. The diffusion protective layer 15 prevents diffusion of the fluorine of the FSG layer 14 into adjacent layers. Both the barrier layer 13 and the FSG layer 14 are made of undoped silicate glass.

However, the conventional ILD fabrication method described above requires an extended time to complete because at least two separate apparatus are used to form the FSG layer 14, the barrier layer 13, and the diffusion protective layer 15.

Hsiao et al., U.S. Pat. No. 6,303,519, describes a method of forming a fluorinated silicon oxide layer or an FSG film having a dielectric constant less than 3.2. The method described in Hsiao et al. supplies a fluorine-rich gas and an oxygen-rich gas into a reacting chamber, and creates a plasma environment in the reacting chamber. The flow rate of the oxygen-rich gas is adjusted until the ratio of the flow rate of the oxygen-rich gas to the total flow rate of the fluorine-rich gas and a silicon-rich gas is less than or equal to a pre-selected value to form the FSG film.

Cha et al., U.S. Pat. No. 6,376,360, describes a method of forming metal structures, encapsulated in silicon rich oxide (hereinafter referred to as "SRO") to protect the metal structures from the corrosive effects of fluorine radicals.

Liu et al., U.S. Pat. No. 6,586,347, describes an improved composite dielectric structure and method of forming the same which prevents delamination of FSG (F-doped $SiO_2$), and allows FSG to be used as the inter-level dielectric between successive conducting interconnection patterns in multilevel integrated circuit structures.

DETAILED DESCRIPTION

Figure 1:
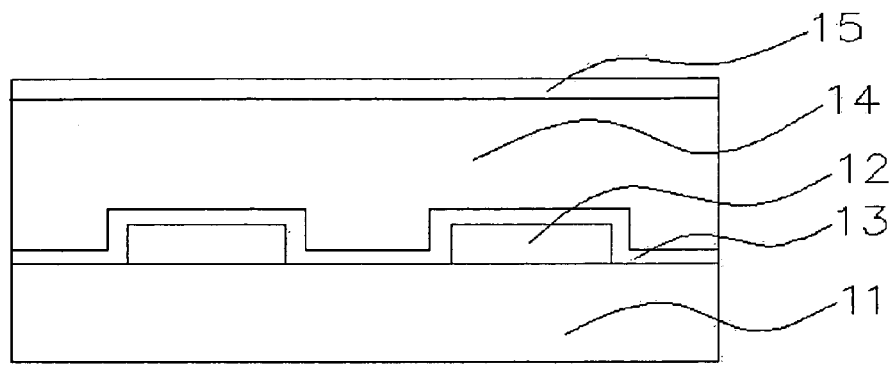
FIG. 1 is a cross-sectional view illustrating a conventional semiconductor device.
Figure 2A:
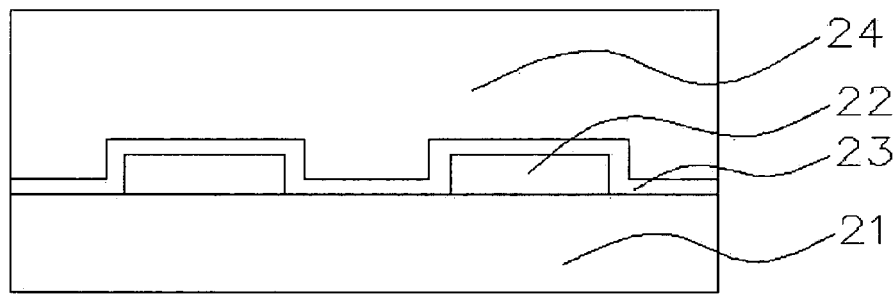
FIG. 2a and FIG. 2b are cross-sectional views illustrating example ILDs constructed in accordance with the teachings of the present invention.

FIG. 2a is a cross-sectional view illustrating an example ILD constructed in accordance with the teachings of the present invention. In the example of FIG. 2a, metal is formed on a substrate 21. (Devices such as a field oxide layer, a gate oxide layer, gate electrodes, and source/drains (not shown) may be formed in and/or on the substrate 21). Subsequently, a patterning process and an etching process is performed on the metal to form metallic interconnects 22. The resulting structure is transferred into an apparatus for a PECVD (plasma enhanced chemical vapor deposition) or a HDP-CVD (high density plasma-chemical vapor deposition) process. Next, RF power between about 2000 W and about 5000 W, (preferably, about 3500 W), is applied. In addition, between about 90 sccm and about 130 sccm of $SiH_4$ gas, between about 120 sccm and about 160 sccm of $O_2$ gas, and between about 60 sccm and about 70 sccm of Ar gas are supplied to form an SRO layer 23 on the metallic interconnects 22. Preferably, about 110 sccm of $SiH_4$ gas, about 145 sccm of $O_2$ gas, and about 65 sccm of Ar gas are supplied.

An FSG layer 24 is formed on the SRO layer 23 within the same apparatus. RF power between about 2000 W and about 5000 W, (preferably about 3500 W), is applied. Between about 60 sccm and about 110 sccm of $SiH_4$ gas, between about 120 sccm and about 160 sccm of $O_2$ gas, between about 60 and about 70 sccm of Ar gas, and between about 50 sccm and about 80 sccm of $SiF_4$ gas are supplied to form the FSG layer 24. Preferably, about 110 sccm of $SiH_4$ gas, about 145 sccm of $O_2$ gas, about 65 sccm of Ar gas, and about 65 sccm of $SiF_4$ are supplied. Except for the addition of the SiF4 gas, the conditions for forming the FSG layer 24 are substantially identical to the conditions for forming the SRO layer 23. In other words, the SRO layer 23 of the example of FIG. 2a is formed using a gas mixture including the $SiH_4$, $O_2$, and Ar gases noted above. Subsequently, the FSG layer 24 is formed by adding the SiF4 gas to the gas mixture in the same apparatus.

Subsequently, a planarization process such as a CMP (chemical mechanical polishing) process is conducted. In the example of FIG. 2a, the thickness of the SRO layer 23 is between about 500 Å and about 2000 Å. Preferably, the SRO layer 23 has a thickness of about 1000 Å. The FSG layer 24 should have enough thickness to insulate the metallic interconnects 22.

Figure 2B:
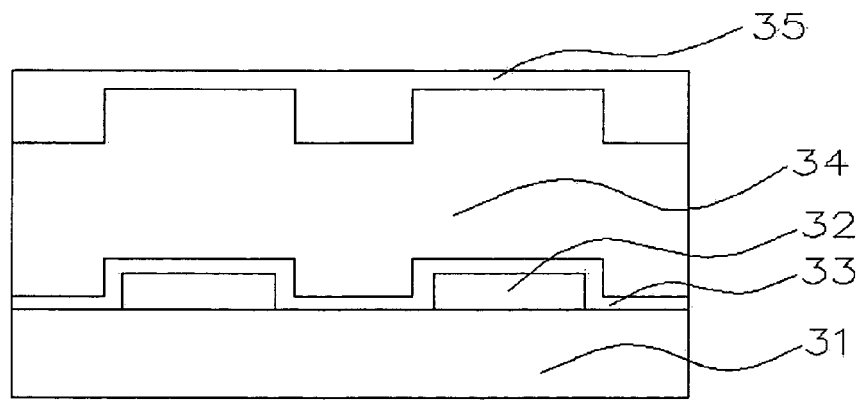

FIG. 2b is a cross-sectional view illustrating another example ILD constructed in accordance with the teachings of the present invention. Referring to FIG. 2b, metallic interconnects 32, a first SRO layer 33, and an FSG layer 34 are sequentially formed on a substrate 31 by performing the same processes described above in connection with FIG. 2a. (The substrate may include active and/or passive devices). Subsequently, a $SiF_4$ gas is removed from an apparatus containing the substrate by a purge process using an inert gas such as Ar gas. A second SRO layer 35 is then formed on the FSG layer 34 under the same conditions which were used to form the first SRO layer 33. A planarization process is then performed on the second SRO layer 35. In the illustrated example, the second SRO layer 35 is planarized to have enough thickness to prevent the diffusion of the fluorine of the FSG layer 34. In the example of FIG. 2b, the thickness of the first SRO layer 33 is between about 500 Å and about 2000 Å. Preferably, the first SRO layer 33 has a thickness of about 1000 Å. The refractive index of the FSG layer 34 is between about 1.5 and about 1.6. Preferably, the FSG layer 34 has a refractive index of about 1.467 and each of the first and second SRO layers 33 and 35 has a refractive index of about 1.523.

The first and second SRO layers 33 and 35 prevent diffusion of the fluorine of the FSG layer 34 by coupling the fluorine with extra silicon which is unreacted with $O_2$ of the SRO layers 33, 35. In particular, the fluorine is trapped by the electric effect of Hydrogenated silicon generated from the $SiH_4$ gas. Thus, the SRO layers 33 and 35 function as protective layers to prevent diffusion of the fluorine. Therefore, in the example of FIG. 2a, the SRO layer 13 can prevent diffusion of the fluorine into the metallic interconnects 12. In the second example, the SRO layers 33 and 35 can prevent both upward diffusion of fluorine and downward diffusion of fluorine into the metallic interconnects 32.

Accordingly, the disclosed methods and apparatus prevent diffusion of the fluorine of an FSG layer into metallic interconnects by forming at least one SRO layer. Thus, corrosion of the metallic interconnects due to diffusion of fluorine from the FSG layer can be avoided. Moreover, processing time can be reduced because at least one SRO layer and the FSG layer may be sequentially formed in one apparatus.

From the foregoing, persons of ordinary skill in the art will appreciate that methods for fabricating an interlayer dielectric layer have been disclosed. The disclosed methods can reduce manufacturing time and cost by forming an FSG layer and at least one SRO layer in a single apparatus (i.e., without moving the device being fabricated from one processing apparatus to another). Further, the disclosed methods prevent corrosion of metallic interconnect(s) which would otherwise be caused by diffusion of fluorine.

An illustrated method for fabricating an ILD comprises: forming metallic interconnects on a substrate; depositing an SRO layer on the metallic interconnects; forming an FSG layer on the SRO layer; and performing a polishing process on the resulting structure.

Conventionally, when an FSG layer is used as an ILD, an oxide layer having a refractive index of about 1.46 is employed to minimize the effect of the fluorine of the FSG layer on the metallic interconnects. However, an SRO layer, which has a refractive index of about 1.5, has recently been used to prevent diffusion of the fluorine of the FSG layer. Conventionally, the SRO layer is deposited in separate apparatus before/after the formation of the FSG layer. However, because the FSG layer is deposited over the metallic interconnects, the fluorine of the FSG layer may diffuse into the metallic interconnects. The disclosed methods address this issue by sequentially forming at least one SRO layer to protect the metallic interconnects and the FSG layer in a single apparatus.

It is noted that this patent claims priority from Korean Patent Application Serial Number 10-2003-0070851, which was filed on Oct. 11, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating an interlayer dielectric layer comprising:
    forming a metallic interconnect on a substrate;
    depositing an SRO layer on the metallic interconnect while the substrate is located in a chamber;
    forming an FSG layer on the SRO layer without removing the substrate from the chamber
    performing a purge process with an inert gas after the FSG layer is formed;
    depositing a second SRO layer on the FSG layer without removing the substrate from the chamber; and
    performing a planarization process on the second SRO layer, wherein the second SRO layer is planarized to a thickness that prevents the diffusion of fluorine of the FSG layer.

2. A method as defined in claim 1, wherein the SRO layer is formed using RF power between about 2000 W and about 5000 W, between about 90 sccm and about 130 sccm of $SiH_4$ gas, between about 120 sccm and about 160 sccm of $O_2$ gas, and between about 60 sccm and about 70 sccm of Ar gas.

3. A method as defined in claim 1, wherein the second SRO layer is formed using RF power between about 2000 W and about 5000 W, between about 90 sccm and about 130 sccm of $SiH_4$ gas, between about 120 sccm and about 160 sccm of $O_2$ gas, and between about 60 sccm and about 70 sccm of Ar gas.

4. A method as defined in claim 1, wherein the FSG layer is formed using RF power between about 2000 W and about 5000 W, between about 60 sccm and about 110 sccm of $SiH_4$ gas, between about 120 sccm and about 160 sccm of $O_2$ gas, between about 60 sccm and about 70 sccm of Ar gas, and between about 50 sccm and about 80 sccm of $SiF_4$.

5. A method as defined in claim 1, wherein the SRO layer on the metallic interconnects has a thickness between about 500 Å and about 2000 Å.

6. A method as defined in claim 1, wherein the SRO layer has a refractive index between about 1.5 and 1.6.

7. A method as defined in claim 1, wherein the second SRO layer has a refractive index between about 1.5 and 1.6.

* * * * *